US012765399B2

(12) United States Patent
Lu et al.

(10) Patent No.: US 12,765,399 B2
(45) Date of Patent: Oct. 13, 2026

(54) DOUBLE-SIDE COOLED POWER MODULES WITH SINTERED-SILVER INTERPOSERS

(71) Applicant: VIRGINIA TECH INTELLECTUAL PROPERTIES, INC., Blacksburg, VA (US)

(72) Inventors: Guo-Quan Lu, Blacksburg, VA (US); Chao Ding, Blacksburg, VA (US)

(73) Assignee: VIRGINIA TECH INTELLECTUAL PROPERTIES, INC., Blacksburg, VA (US)

( * ) Notice: Subject to any disclaimer, the term of this patent is extended or adjusted under 35 U.S.C. 154(b) by 363 days.

(21) Appl. No.: 18/549,443

(22) PCT Filed: Mar. 11, 2022

(86) PCT No.: PCT/US2022/071087
§ 371 (c)(1),
(2) Date: Sep. 7, 2023

(87) PCT Pub. No.: WO2022/213013
PCT Pub. Date: Oct. 6, 2022

(65) Prior Publication Data

US 2024/0153862 A1 May 9, 2024

Related U.S. Application Data

(60) Provisional application No. 63/167,885, filed on Mar. 30, 2021.

(51) Int. Cl.
*H10W 70/40* (2026.01)
*H10D 62/832* (2025.01)
(Continued)

(52) U.S. Cl.
CPC ...... *H10W 70/479* (2026.01); *H10D 62/8325* (2025.01); *H10W 20/427* (2026.01);
(Continued)

(58) Field of Classification Search
CPC ......... H01L 23/49861; H01L 23/49822; H01L 23/49844; H01L 23/49894; H01L 23/5286;
(Continued)

(56) References Cited

U.S. PATENT DOCUMENTS 8,358,000 B2 1/2013 Beaupre et al.
8,987,876 B2 3/2015 Gowda et al.
(Continued)

FOREIGN PATENT DOCUMENTS

CN 108715992 B 12/2019
CN 110571204 A 12/2019
(Continued)

OTHER PUBLICATIONS

International Search Report and Written Opinion for PCT/US2022/071087 mailed Jun. 8, 2022.
(Continued)

*Primary Examiner* — Elias Ullah
(74) *Attorney, Agent, or Firm* — Perilla Knox & Hildebrandt LLP; Jason M. Perilla

(57) ABSTRACT

Planar, double-side cooled half-bridge power modules using sintered-silver interposers and all sintered-silver joints are described. Thermo-mechanical simulations showed that use of the sintered-silver interposers reduce the thermo-mechanical stresses at vulnerable interfaces as compared to using solid copper interposers. The porous sintered-silver interposers are also easily deformable under a low load, which improves the yield of module interconnections in the presence of imperfections caused by variations in die thickness, interposer height, and substrate distortion. Results on the electrical performance of the modules validate the fab-
(Continued)

rication approach for the modules, for making high power-density converters with reliable operations at high junction temperatures.

19 Claims, 6 Drawing Sheets

(51) Int. Cl.

| | |
|---|---|
| ***H10W 20/41*** | (2026.01) |
| ***H10W 70/65*** | (2026.01) |
| ***H10W 70/685*** | (2026.01) |
| ***H10W 70/69*** | (2026.01) |
| *H10W 72/00* | (2026.01) |
| *H10W 90/00* | (2026.01) |

(52) U.S. Cl.

CPC ....... *H10W 70/658* (2026.01); *H10W 70/685* (2026.01); *H10W 70/69* (2026.01); *H10W 72/01365* (2026.01); *H10W 90/736* (2026.01); *H10W 90/756* (2026.01)

(58) Field of Classification Search

CPC ......... H01L 24/27; H01L 24/32; H01L 24/48; H01L 2224/27848; H01L 2224/32245; H01L 2224/48245; H01L 2924/351; H01L 2924/37001; H01L 24/06; H01L 24/29; H01L 24/73; H01L 2224/04042; H01L 24/83; H01L 24/33; H01L 24/45; H01L 24/92; H01L 2224/04034; H01L 2224/0603; H01L 2224/29339; H01L 2224/32225; H01L 2224/33181; H01L 2224/45015; H01L 2224/45124; H01L 2224/48247; H01L 2224/49175; H01L 2224/73215; H01L 2224/73265; H01L 2224/83192; H01L 2224/83194; H01L 2224/83203; H01L 2224/8384; H01L 2224/92247; H01L 2924/10272; H01L 2924/13091; H01L 23/49531; H01L 23/49562; H01L 23/49575; H01L 23/49811; H01L 23/49833; H01L 25/072; H01L 23/3735; H10D 62/8325

See application file for complete search history.

(56) References Cited

U.S. PATENT DOCUMENTS

| | | | | |
|---|---|---|---|---|
| 9,041,183 | B2 | 5/2015 | Liang et al. | |
| 10,141,254 | B1 | 11/2018 | Xu et al. | |
| 2013/0294042 | A1 | 11/2013 | Lu et al. | |
| 2016/0133594 | A1 | 5/2016 | Huang et al. | |
| 2019/0157229 | A1 | 5/2019 | Satoh et al. | |
| 2019/0355689 | A1 | 11/2019 | Ho et al. | |
| 2021/0151416 | A1* | 5/2021 | Niu | H01L 23/49811 |
| 2024/0153862 | A1 | 5/2024 | Lu et al. | |
| 2024/0178126 | A1 | 5/2024 | Lu et al. | |

FOREIGN PATENT DOCUMENTS

| | | | |
|---|---|---|---|
| JP | 2006310543 | A | 9/2023 |
| WO | 2019185391 | A1 | 10/2019 |

OTHER PUBLICATIONS

International Search Report and Written Opinion for PCT/US2022/071120 mailed Oct. 26, 2022.

Non-final Office Action for U.S. Appl. No. 18/549,447 mailed Mar. 25, 2026.

"Analysis of innovation trends in packaging for power modules," in Proc. 7th Eur. Adv. Technol. Workshop Micropackaging Thermal Management, IMAPS, Feb. 1-2, 2012.

A. Galland and F. Wakeman, "Application of Press-pack IGBTs in traction refurbishment," in Conference Record of the 2005 IEEE Industry Applications Conference, Fortieth IAS Annual Meeting, 2005, pp. 2030-2036.

C. Chen, K. Suganuma, T. Iwashige, K. Sugiura, and K. Tsuruta, "High-temperature reliability of sintered microporous Ag on electroplated Ag, Au, and sputtered Ag metallization substrates," Journal of Materials Science: Materials in Electronics, vol. 29, No. 3, pp. 2065-2075, Feb. 2018, doi: 10.1007/s10854-017-8087-8.

C. DiMarino, B. Mouawad, C. M. Johnson, M. Wang, Y.-S. Tan, G.-Q. Lu, D. Boroyevich, and R. Burgos, "Design and experimental validation of a wire-bond-less 10-kV SiC MOSFET power module," IEEE Journal of Emerging and Selected Topics in Power Electronics, vol. 8, No. 3, pp. 2240-2252, Sep. 2020, doi: 10.1109/JESTPE.2019.2944138.

C. Ding, H. Liu, K. D. T. Ngo, R. Burgos, and G.-Q. Lu, "A double-side cooled SiC MOSFET power module with sintered-silver interposers: I-Design, simulation, fabrication, and performance characterization," IEEE Transactions on Power Electronics, vol. 36, No. 11, pp. 12768-12779, Nov. 2021, doi: 10.1109/TPEL.2021.3070326.

C. Luechinger, R. Chen, J. Fu, B. Poncelet, O. Valentin, T. J. Walker, and T. Xu, "Aluminum-copper ribbon interconnects for power devices," IEEE Transactions on Components, Packaging and Manufacturing Technology, vol. 7, No. 9, pp. 1567-1578, Sep. 2017, doi: 10.1109/TCPMT.2017.2712694.

D. W. Berry, "Design, analysis, and experimental verification of a mechanically compliant interface for fabricating reliable, double-side cooled, high-temperature, sintered silver interconnected power modules," Ph.D. dissertation, Dept. Mater. Sci. Eng., Virginia Polytechnic Institute and State University, Blacksburg, Virginia, USA, 2014.

D.-J. Yu, X. Chen, G. Chen, G.-Q. Lu, and Z.-Q. Wang, "Applying Anand model to low-temperature sintered nanoscale silver paste chip attachment," Materials & Design, vol. 30, No. 10, pp. 4574-4579, Dec. 2009, doi: 10.1016/j.matdes.2009.04.010.

E. Hoene, A. Ostmann, and C. Marczok, "Packaging very fast switching semiconductors," in Proc. Int. Conf. Integrated Power Electronics Systems (CIPS), Nuremberg, Germany, Feb. 2014, pp. 1-11.

E. Vagnon, J.-C. Crebier, Y. Avenas, and P.-O. Jeannin, "Study and realization of a low force 3D press-pack power module," in Proc. 2008 IEEE Electrical Design of Advanced Packaging and Systems (EDAPS), 2008, pp. 1049-1054.

E. Vagnon, P.-O. Jeannin, J.-C. Crébier, and Y. Avenas, "A bus-bar-like power module based on three-dimensional power-chip-on-chip hybrid integration," IEEE Transactions on Industry Applications, vol. 46, No. 5, pp. 1511-1519, Sep.-Oct. 2010, doi: 10.1109/TIA.2010.2057401.

F. Hou, W. Wang, L. Cao, J. Li, M. Su, T. Lin, G. Zhang, and B. Ferreira, "Review of packaging schemes for power module," IEEE Journal of Emerging and Selected Topics in Power Electronics, vol. 8, No. 1, pp. 223-238, Mar. 2020, doi: 10.1109/JESTPE.2019.2947645.

H. Lee V. Smet, and R. Tummala, "A review of SiC power module packaging technologies: Challenges, advances, and emerging issues," IEEE Journal of Emerging and Selected Topics in Power Electronics, vol. 8, No. 1, pp. 239-255, Mar. 2020, doi: 10.1109/JESTPE.2019.2951801.

H. Schwarzbauer and R. Kuhnert, "Novel large area joining technique for improved power device performance," IEEE Transactions on Industry Applications, vol. 27, No. 1, pp. 93-99, Jan./Feb. 1991, doi: 10.1109/28.120257.

J. G. Bai, Z. Z. Zhang, J. N. Calata, and G.-Q. Lu, "Low-temperature sintering of nanoscale silver pastes for high- performance and highly-reliable device interconnection," in Proc. ASME Int. Mech. Eng. Congr. Expo. (IMECE), Orlando, FL, USA, Nov. 5-11, 2005, Paper IMECE2005-79187.

(56) References Cited

OTHER PUBLICATIONS

J. Yin, Z. Liang, and J. D. van Wyk, "High temperature embedded SiC chip module (ECM) for power electronics applications," IEEE Trans. Power Electron., vol. 22, No. 2, pp. 547-556, Mar. 2007, doi: 10.1109/TPEL.2006.889901.
Jaejin Jeon, Jihwan Seong, Jangmuk Lim, Min Ki Kim, Taehwa Kim, and Sang Won Yoon, "Finite Element and Experimental Analysis of Spacer Designs for Reducing the Thermomechanical Stress in Double-Sided Cooling Power Modules," IEEE Journal of Emerging and Selected Topics in Power Electronics, vol. 9, No. 4, pp. 3994-4005, Aug. 2021, doi: 10.1109/JESTPE.2020.2998546.
Jaesik Lee, Daniel Moses Fernandez, Myo Paing, Yen Chen Yeo, and Shan Gao, "Electroless Ni Plating to Compensate for Bump Height Variation in Cu—Cu 3-D Packaging," IEEE Transactions on Components, Packaging and Manufacturing Technology, vol. 2, No. 6, pp. 1002-1010, Jun. 2012, doi: 10.1109/TCPMT.2011.2177269.
Jesus N. Calata, John G. Bai, Xingsheng Liu, Sihua Wen, and Guo-Quan Lu, "Three-Dimensional Packaging for Power Semiconductor Devices and Modules," IEEE Transactions on Advanced Packaging, vol. 28, No. 3, pp. 418-428, Aug. 2005, doi: 10.1109/TADVP.2005.852837.
Jianfeng Li, Alberto Castellazzi, Tianxiang Dai, Martin Corfield, Adane Kassa Solomon, and Christopher M. Johnson, "Built-in Reliability Design of Highly Integrated Solid-State Power Switches With Metal Bump Interconnects," IEEE Transactions on Power Electronics, vol. 30, No. 5, pp. 2587-2597, May 2015, doi: 10.1109/TPEL.2014.2357334.
Jianfeng Li, Christopher M. Johnson, Cyril Buttay, Wissam Sabbah, and Stéphane Azzopardi, "Bonding Strength of Multiple SiC Die Attachment Prepared by Sintering of Ag Nanoparticles," Journal of Materials Processing Technology, vol. 215, pp. 299-308, 2015, doi: 10.1016/j.jmatprotec.2014.08.002.
Jürgen Schulz-Harder, "Review on Highly Integrated Solutions for Power Electronic Devices," Electrovac Curamik GmbH, Regensburg, Germany, 2010.
K. S. Siow, "Are sintered silver joints ready for use as interconnect material in microelectronic packaging?" J. Electron. Mater., vol. 43, No. 4, pp. 1-??, 2014, doi: 10.1007/s11664-013-2967-3.
K. Sugiura, T. Iwashige, K. Tsuruta, C. Chen, S. Nagao, T. Funaki, and K. Suganuma, "Reliability evaluation of SiC power module with sintered Ag die attach and stress-relaxation structure," IEEE Trans. Compon., Packag. Manuf. Technol., vol. 9, No. 4, pp. 1-??, Apr. 2019, doi: 10.1109/TCPMT.2019.2901543.
L. A. Navarro, X. Perpiñà, P. Godignon, J. Montserrat, V. Banu, M. Vellvehi, and X. Jordà, "Thermomechanical assessment of die-attach materials for wide bandgap semiconductor devices and harsh environment applications," IEEE Trans. Power Electron., vol. 29, No. 5, pp. 2152-2163, May 2014, doi: 10.1109/TPEL.2013.2279607.
L. Cheng, A. K. Agarwal, S. Dhar, S.-H. Ryu, and J. W. Palmour, "Static performance of 20 A, 1200 V 4H-SiC power MOSFETs at temperatures of 187° C to 300° C ," J. Electron. Mater., vol. 41, No. 5, pp. 910-916, Mar. 2012, doi: 10.1007/s11664-012-2000-2.
L. Coppola, D. Huff, F. Wang, R. Burgos, and D. Boroyevich, "Survey on high-temperature packaging materials for SiC-based power electronics modules," Proc. IEEE Engineering Research Center Program (CPES), Virginia Tech, Blacksburg, VA, USA, 2007.
L. Ménager, M. Soueidan, B. Allard, V. Bley, and B. Schlegel, "A lab-scale alternative interconnection solution of semiconductor dice compatible with power modules 3-D integration," IEEE Trans. Power Electron., vol. 25, No. 7, pp. 1667-1670, Jul. 2010, doi: 10.1109/TPEL.2010.2041557.
M. Horio, Y. Iizuka, Y. Ikeda, E. Mochizuki, and Y. Takahashi, "Ultra compact and high reliable SiC MOSFET power module with 200° C operating capability," in Proc. 2012 24th Int. Symp. Power Semiconductor Devices and ICs (ISPSD), Bruges, Belgium, Jun. 2012.
M. Mermet-Guyennet, A. Castellazzi, P. Lasserre, and J. Saiz, "3D integration of power semiconductor devices based on surface bump technology," in Proc. Eur. Conf. Power Electron. Appl. (EPE), 2005.
M. Wang et al., "Reliability improvement of a double-sided IGBT module by lowering stress gradient using molybdenum buffers," IEEE J. Emerg. Sel. Topics Power Electron., vol. 7, No. 3, pp. 1432-1442, Sep. 2019, doi: 10.1109/JESTPE.2019.2920254.
N. Khan, S. W. Yoon, A. G. K. Viswanath, V. P. Ganesh, R. Nagarajan, D. Witarsa, S. Lim, and K. Vaidyanathan, "Development of 3-D stack package using silicon interposer for high-power application," IEEE Trans. Adv. Packag., vol. 31, No. 1, pp. 65-74, Feb. 2008, doi: 10.1109/TADVP.2008.915854.
P. Ning, R. Lai, D. Huff, F. (Fred) Wang, K. D. T. Ngo, V. D. Immanuel, and K. J. Karimi, "SiC wirebond multichip phase-leg module packaging design and testing for harsh environment," IEEE Trans. Power Electron., vol. 25, No. 1, pp. 2-16, Jan. 2010, doi: 10.1109/TPEL.2009.2027324.
P. Ning, T. G. Lei, F. (Fred) Wang, G.-Q. Lu, K. D. T. Ngo, and K. Rajashekara, "A novel high-temperature planar package for SiC multichip phase-leg power module," IEEE Trans. Power Electron., vol. 25, No. 8, pp. 1893-1902, Aug. 2010, doi: 10.1109/TPEL.2010.2046498.
Q. Zhu, A. Forsyth, R. Todd, and L. Mills, "Thermal characterisation of a copper-clip-bonded IGBT module with double-sided cooling," in Proc. 23rd Int. Workshop Thermal Investigations of ICs and Systems (Therminic), Amsterdam, Netherlands, Sep. 2017.
R. Khazaka, L. Mendizabal, D. Henry, and R. Hanna, "Survey of high-temperature reliability of power electronics packaging components," IEEE Transactions on Power Electronics, vol. 30, No. 5, pp. 2450-2476, May 2015, doi: 10.1109/TPEL.2014.2357836.
R. Wang, Z. Chen, D. Boroyevich, L. Jiang, Y. Yao, and K. Rajashekara, "A novel hybrid packaging structure for high- temperature SiC power modules," IEEE Transactions on Industry Applications, vol. 49, No. 4, pp. 1719-1727, Jul./Aug. 2013, doi: 10.1109/TIA.2013.2257977.
S. Haque, K. Xing, R.-L. Lin, C. T. A. Suchicital, G.-Q. Lu, D. J. Nelson, D. Borojević, and F. C. Lee, "An innovative technique for packaging power electronic building blocks using metal posts interconnected parallel plate structures," IEEE Transactions on Advanced Packaging, vol. 22, No. 2, pp. 136-144, May 1999, doi: 10.1109/6046.774173.
S. L. Rumyantsev, M. S. Shur, M. E. Levinshtein, P. A. Ivanov, J. W. Palmour, A. K. Agarwal, B. A. Hull, and S.-H. Ryu, "Channel mobility and on-resistance of vertical double implanted 4H-SiC MOSFETs at elevated temperatures," Semiconductor Science and Technology, vol. 24, No. 7, pp. 075011, 2009, doi: 10.1088/0268-1242/24/7/075011.
S. S. Wen, D. Huff, G.-Q. Lu, et al., "An innovative technique for packaging power electronic building blocks using metal posts interconnected parallel plate structures," IEEE Trans. Adv. Packag., vol. 22, No. 2, pp. 136-144, May 1999.
S. Seal, M. D. Glover, and H. A. Mantooth, "3-D wire bondless switching cell using flip-chip-bonded silicon carbide power devices," IEEE Transactions on Power Electronics, vol. 33, No. 10, pp. 8553-8564, Oct. 2018.
T. Y. Hung, S. Y. Chiang, C. J. Huang, C. C. Lee, and K. N. Chiang, "Thermal-mechanical behavior of the bonding wire for a power module subjected to the power cycling test," Microelectronics Reliability, vol. 51, No. 9-11, pp. 1819-1823, Jul. 2011.
T. Youssef, W. Rmili, E. Woirgard, S. Azzopardi, N. Vivet, D. Martineau, R. Meuret, G. Le Quilliec, and C. Richard, "Power modules die attach: A comprehensive evolution of the nanosilver sintering physical properties versus its porosity," Microelectronics Reliability, vol. 55, pp. 1997-2002, 2015.
W. Sanfins, D. Risaletto, F. Richardeau, G. Blondel, M. Chemin, and P. Baudesson, "Preliminary failure-mode characterization of emerging direct-lead-bonding power module. Comparison with standard wire-bonding interconnection," Microelectronics Reliability, vol. 55, No. 9-10, pp. 1956-1960, Jul. 2015, doi: 10.1016/j.microrel.2015.06.006.
X. Cao, G.-Q. Lu, and K. D. T. Ngo, "Planar power module with low thermal impedance and low thermomechanical stress," IEEE Trans-

(56) References Cited

OTHER PUBLICATIONS actions on Components, Packaging and Manufacturing Technology, vol. 2, No. 8, pp. 1247-1256, Aug. 2012, doi: 10.1109/TCPMT.2012.2196799.

X. Cao, T. Wang, K. D. T. Ngo, and G.-Q. Lu, "Parametric study of joint height for a medium-voltage planar package," IEEE Transactions on Components and Packaging Technologies, vol. 33, No. 3, pp. 547-554, Sep. 2010, doi: 10.1109/TCAPT.2010.2046639.

X. Liu, S. Haque, and G.-Q. Lu, "Three-dimensional flip-chip on flex packaging for power electronics applications," IEEE Transactions on Advanced Packaging, vol. 24, No. 1, pp. 56-64, Feb. 2001, doi: 10.1109/6040.915558.

X. Zhao, B. Gao, Y. Jiang, L. Zhang, S. Wang, Y. Xu, K. Nishiguchi, Y. Fukawa, and D. C. Hopkins, "Flexible epoxy-resin substrate based 1.2 kV SiC half bridge module with ultra-low parasitics and high functionality," in Proc. IEEE Energy Conversion Congress and Exposition (ECCE), pp. 1-8, 2020, doi: 10.1109/ECCE44975.2020.9236400.

Y. Mei, G.-Q. Lu, X. Chen, S. Luo, and D. Ibitayo, "Migration of sintered nanosilver die-attach material on alumina substrate between 250° C and 400° C in dry air," IEEE Transactions on Device and Materials Reliability, vol. 11, No. 2, pp. 316-324, Jun. 2011, doi: 10.1109/TDMR.2010.2064775.

Y. Pascal, D. Labrousse, M. Petit, S. Lefebvre, and F. Costa, "Experimental investigation of the reliability of printed circuit board (PCB)-embedded power dies with pressed contact made of metal foam," Microelectronics Reliability, vol. 88-90, pp. 707-714, Sep. 2018, doi: 10.1016/j.microrel.2018.06.064.

Y. Pascal, D. Labrousse, M. Petit, S. Lefebvre, and F. Costa, "PCB-embedding of power dies using pressed metal foam," Microelectronics Reliability, vol. 88-90, pp. 707-714, 2018, doi: 10.1016/j.microrel.2018.06.064.

Y. Ren, X. Yang, F. Zhang, L. Wang, K. Wang, W. Chen, X. Zeng, and Y. Pei, "Voltage suppression in wire-bond-based multichip phase-leg SiC MOSFET module using adjacent decoupling concept," IEEE Transactions on Industrial Electronics, vol. 64, No. 11, pp. 8647-8657, Nov. 2017, doi: 10.1109/TIE.2017.2714149.

Y. Yang, L. Dorn-Gomba, R. Rodriguez, C. Mak, and A. Emadi, "Automotive power module packaging: current status and future trends," IEEE Access, vol. 8, pp. 160126-160146, 2020, doi: 10.1109/ACCESS.2020.3019775.

Y. Yao, G.-Q. Lu, D. Boroyevich, and K. D. T. Ngo, "Survey of high-temperature polymeric encapsulants for power electronics packaging," IEEE Transactions on Components, Packaging and Manufacturing Technology, vol. 5, No. 2, pp. 168-184, Feb. 2015, doi: 10.1109/TCPMT.2014.2337300.

Y. Yao, Z. Chen, G.-Q. Lu, D. Boroyevich, and K. D. T. Ngo, "Characterization of encapsulants for high-voltage high-temperature power electronic packaging," IEEE Transactions on Components, Packaging and Manufacturing Technology, vol. 2, No. 4, pp. 539-550, Apr. 2012, doi: 10.1109/TCPMT.2011.2173344.

Z. Chen, Y. Yao, D. Boroyevich, K. D. T. Ngo, P. Mattavelli, and K. Rajashekara, "A 1200-V, 60-A SiC MOSFET multichip phase-leg module for high-temperature, high-frequency applications," IEEE Transactions on Power Electronics, vol. 29, No. 5, pp. 2468-2478, May 2014, doi: 10.1109/TPEL.2013.2283245.

Z. Chen, Y. Yao, W. Zhang, D. Boroyevich, K. Ngo, P. Mattavelli, and R. Burgos, "Development of a 1200 V, 120 A SiC MOSFET module for high-temperature and high-frequency applications," in Proc. IEEE Energy Conversion Congress and Exposition (ECCE), 2013, pp. 52-59.

Z. Liang, B. Lu, J. D. van Wyk, and F. C. Lee, "Integrated CoolMOS FET/SiC-diode module for high performance power switching," IEEE Transactions on Power Electronics, vol. 20, No. 3, pp. 679-688, May 2005, doi: 10.1109/TPEL.2005.846547.

* cited by examiner

DOUBLE-SIDE COOLED POWER MODULES WITH SINTERED-SILVER INTERPOSERS

CROSS REFERENCE TO RELATED APPLICATIONS

This application is a 35 U.S.C. § 371 national stage patent application of Patent Cooperation Treaty application number PCT/US2022/071087, filed Mar. 11, 2022, and titled "DOUBLE-SIDE COOLED POWER MODULES WITH SINTERED-SIL VER INTERPOSERS," which claims priority to and the benefit of U.S. Provisional Application No. 63/167,885, filed Mar. 30, 2021, the entire contents of both of which applications are hereby incorporated herein by reference.

GOVERNMENT LICENSE RIGHTS

This invention was made with government support under Grant No. DE-EE0008706 awarded by the United States Department of Energy. The government has certain rights in the invention.

BACKGROUND OF THE INVENTION

With advances in medium- and high-voltage silicon carbide (SiC) devices, wide-bandgap semiconductors can be used in power grid applications. SiC power devices offer the benefits of small size, less weight, high efficiency, and other benefits for power conversion in power grids. However, the high blocking voltages of these devices place a stringent demand on electrical insulation of the packages that interconnect and insulate the devices. The constant push for higher packaging power density only exacerbates the challenge. Over the last twenty years, various module packaging approaches have been developed to improve thermal performance and increase power density. Many approaches involve replacing the conventional wire-bonded structures with sandwiched or planar structures having low package parasitic inductances. Some planar packaging approaches are already being relied upon for semiconductor devices in the sub-kV to 1.2-kV range.

SUMMARY OF THE INVENTION

Planar, double-side cooled half-bridge power modules using sintered-silver interposers and all sintered-silver joints are described. Use of the sintered-silver interposers reduces thermo-mechanical stresses at vulnerable interfaces in the power modules as compared to using solid copper interposers. The porous sintered-silver interposers are also easily deformable under a low load, which improves the yield of module interconnections in the presence of imperfections caused by variations in die thickness, interposer height, and substrate distortion. Results on the electrical performance of the modules validate the fabrication approach for the modules, for making high power-density converters with reliable operations at high junction temperatures.

In one example, a power module includes a first substrate, a second substrate, a plurality of semiconductor transistor die positioned between the first substrate and the second substrate, a plurality of terminal pins, a plurality of power terminals, and a plurality of sintered-silver interposers bonded to a top contact of each of the plurality of semiconductor transistor die and positioned between the first substrate and the second substrate in the power module. The plurality of power terminals are staggered for electrical coupling to a busbar. A bottom surface of each of the plurality of semiconductor transistor die is also secured in electrical contact to at least one of the first substrate or the second substrate.

In one aspect of the embodiments, least one of the first substrate or the second substrate comprises an insulated metal substrate (IMS), such as a direct-bond-copper (DBC) substrate. The IMS includes a layer of ceramic or polymer between two layers of copper in some cases. The IMS includes a layer of ceramic or polymer, a first inner metal layer, and a second inner metal layer in some cases. The bottom surface of a first semiconductor transistor die among the plurality of semiconductor transistor die is bonded to the first inner metal layer using sintered silver paste, and the bottom surface of a second semiconductor transistor die among the plurality of semiconductor transistor die is bonded to the second inner metal layer using sintered silver paste. In other aspects, a first power terminal among the plurality of power terminals is electrically coupled to the first inner metal layer, and a second power terminal among the plurality of power terminals is electrically coupled to the second inner metal layer.

In other aspects, the first substrate includes a first inner metal layer, the second substrate comprises a second inner metal layer. The bottom surface of a first semiconductor transistor die among the plurality of semiconductor transistor die is bonded to the first inner metal layer using sintered silver paste, and the bottom surface of a second semiconductor transistor die among the plurality of semiconductor transistor die is bonded to the second inner metal layer using sintered silver paste.

In other aspects, the power module also includes a first plurality of bond wires electrically coupled from a first semiconductor transistor die among the plurality of semiconductor transistor die to a first subset of the plurality of terminal pins. The power module also includes a second plurality of bond wires electrically coupled from a second semiconductor transistor die among the plurality of semiconductor transistor die to a second subset of the plurality of terminal pins.

The plurality of semiconductor transistor die are coupled in a half bridge configuration and each of the plurality of semiconductor transistor die comprises a Silicon Carbide (SiC) metal oxide semiconductor field effect power transistor in one example. In other aspects, the sintered-silver interposers include interposers cut from a bar of sintered silver paste.

In another embodiment, a process or method of manufacturing a power module is described. In one example, the method includes applying a layer of silver paste on a metal layer of a substrate, positioning a plurality of semiconductor transistor die on the layer of silver paste over the metal layer of the substrate, positioning a plurality of silver interposers on the layer of silver paste over the metal layer of the substrate, and heating the substrate, the plurality of semiconductor transistor die, and the plurality of silver interposers to bond the semiconductor transistor die and first plurality of silver interposers to the substrate.

The heating can include heating at a ramp rate to a temperature of about 245° C., and the method can also include applying pressure to the plurality of silver interposers after reaching the temperature of about 245° C. In one case, applying the pressure comprises applying a pressure of about 2-MPa for about 15 minutes.

Additionally, the process can also include applying a second layer of silver paste on top surface contacts of the plurality of semiconductor transistor die, and positioning a second plurality of silver interposers on the second layer of silver paste over the top surface contacts of the plurality of semiconductor transistor die. The process can also include second heating the substrate, the plurality of semiconductor transistor die, the plurality of silver interposers, and the second plurality of silver interposers to bond the second plurality of silver interposers to the plurality of semiconductor transistor die. The second heating can include heating at a ramp rate to a temperature of about 245° C., and the method can also include applying pressure to the second plurality of silver interposers after reaching the temperature of about 245° C.

The method can also include applying a third layer of silver paste on a metal layer of a second substrate, positioning the second substrate over the substrate, with the third layer of silver paste facing the substrate, the plurality of semiconductor transistor die, the plurality of silver interposers, and the second plurality of silver interposers. The method can also include third heating the substrate, the second substrate, the plurality of semiconductor transistor die, the plurality of silver interposers, and the second plurality of silver interposers to bond the second substrate to the first plurality of silver interposers and the second plurality of silver interposers. The third heating can include heating at a ramp rate to a temperature of about 245° C., and the method can also include applying pressure to the second substrate after reaching the temperature of about 245° C.

DETAILED DESCRIPTION

Figure 1A:
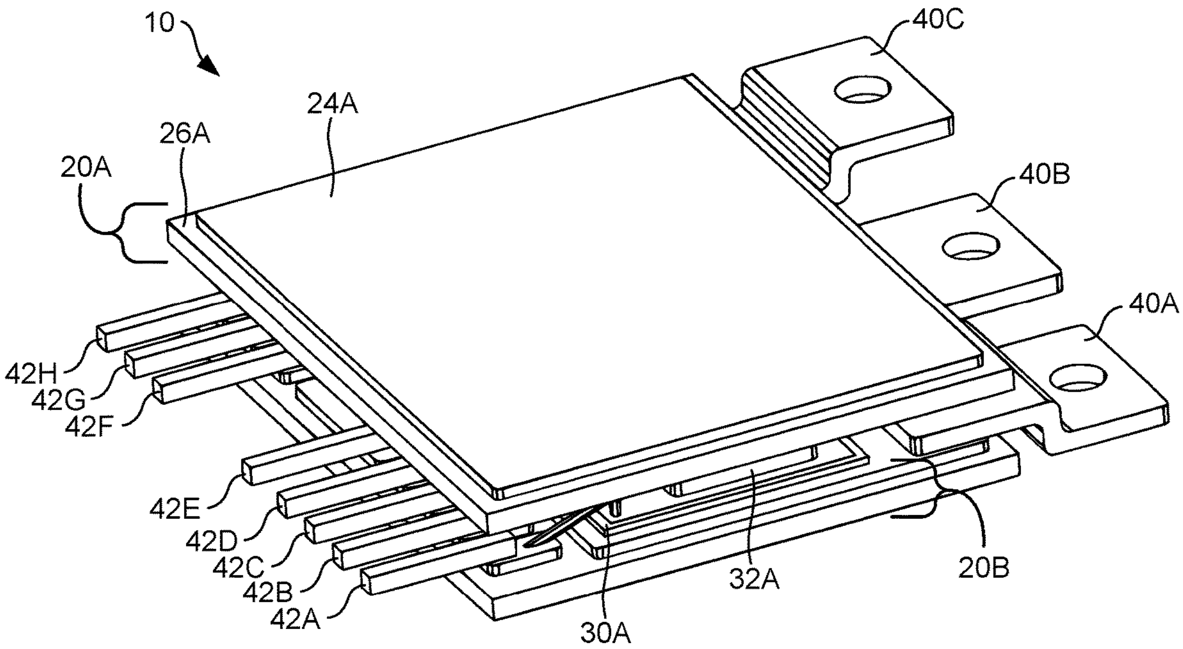
FIG. 1A illustrates a half-bridge power module according to various aspects of the embodiments.

Advances in wide-bandgap devices, such as SiC and gallium nitride (GaN) devices, have facilitated the development of higher efficiency and power-density power electronics converters. These efforts have posed significant challenges on power module packaging, as the packaging structures, materials, and processing conditions significantly influence the thermal, electrical, and mechanical performance and reliability of the modules.

Wire-bond interconnect technology has been used for electrical couplings to the top-side terminals or contacts of semiconductor devices, because of the maturity, low cost, and flexibility of the technology. However, wire-bonded packages have relatively high parasitic inductances and can only cool the devices from one side, the die-attach side. Also, due to mismatched coefficients of thermal expansion (CTE) between the wire bonds and semiconductor devices, the bonded areas are prone to fatigue failure caused by thermo-mechanical stresses. Paralleled wire bonds, ribbon bonds, direct lead bonding, and copper clip structures have been relied upon in some cases to improve current capacity, reduce parasitic inductances, and improve reliability. Modules made by these interconnect techniques, which use long and thin conductors to connect to the top terminals of semiconductor devices, are still limited to cooling from the die-attach side of the device chips.

Other packaging structures have been introduced in an attempt to improve thermal performance, such as metal-post-interconnected-parallel-plate-structures, flip-chip-on-flex, dimple-array, embedded power, silicon interposer, solder bump, metal bump, flip-chip, power overlay, and press-pack packages. However, many of these packages are structurally rigid as compared to wire-bonded packages, raising concerns for thermo-mechanical reliability.

To make a double-side cooled package, interposers such as metal bricks, balls, or tubes can used for interconnections, and copper (Cu) is a widely used interposer. Some designs have shown that the use of solid Cu interposers introduces more thermo-mechanical stresses in the device chips and at bonded interfaces than in wire-bonded packages. To reduce thermo-mechanical stresses, interposers made of molybdenum (Mo) or Cu/Mo/Cu were evaluated, as the CTE of Mo is closer to that of semiconductor materials than Cu. However, Mo has a lower thermal conductivity than Cu and may require a surface metallization to be compatible with soldering or silver-sintering.

One of the main concerns with thermo-mechanical stresses in double-side cooled power modules is the reduced bonding reliability at the chip-attach, interposer-chip, or interposer-substrate interface. Solders are the most commonly used bonding materials in power modules, but they are easily fatigued under thermo-mechanical stresses due to low melting temperatures, low elastic moduli, and the formation of brittle intermetallic. Thus, use of solders for bonding power modules limits their reliable operation to temperatures below about 200° C. in many cases. The assembly of double-side cooled modules also typically requires multiple bonding steps, which can require a set of solders with different melting temperatures, further limiting operational temperatures.

According to aspects of the embodiments, low-temperature silver (Ag) sintering can be relied upon as an alternative bonding technology to soldering. The sintering process can take place at less than 250° C. with or without pressure. Once sintered-silver joints are formed, the joints melt at 960° C. and have much higher thermal and electrical conductivities. Sintered-silver joints or bonds have much better reliability than soldered joints. These advantages make silver sintering an excellent lead-free and reliable solution for packaging double-side cooled and high-temperature power modules.

However, variations in device chip thickness, substrate flatness, and interposer heights can make it relatively difficult to use sintering processes for bonding double-side cooled modules. Soldering processes can easily overcome such variations because, as solders melt and solidify, they can easily "absorb" these variations to maintain continuity in heights, shapes, and other proportions at bonded interfaces. On the other hand, silver does not melt in the low-temperature silver sintering process. Rather, a sintered bond is formed through solid-state atomic diffusion and large volume shrinkage from densification. Silver sintered bonds cannot accommodate large geometric variations at the bonding line or interface. Some designs have used silver-sintering for semiconductor die and interposer attachment but have also used a thick layer of solder (~200 μm) for the interposer-to-substrate bonding, to compensate for thickness and spacing variations.

According to aspects of the embodiments, one solution to enable silver sintering for bonded interfaces in a double-side cooled power module is to use interposers that can be plastically deformed under a low applied load during the assembly process. The deformable interposers and load can be relied upon to level geometric variations. And, to reduce the thermo-mechanical stresses, the interposer are made of materials or structures having low CTE, low elastic modulus, or both. Deformable silver tubing and metal foams have been explored as interposers to achieve adjustable height, but the trade-off is large thermal resistance through the top terminals because of the small heat conduction area.

According to aspects of the embodiments, interposers were formed by low-temperature sintering of a pressure-less silver paste, and the interposers were used along with a silver-sintering process to interconnect a double-side cooled power module. The interposers were made by filling and sintering a silver paste inside a trench in a Teflon block. The trench width defined the height of the interposer. Because the as-sintered silver interposers are relatively porous, the interposers can be deformed relatively easily during assembly processes, to accommodate geometric variations found in semiconductor die, substrates, and other components in power modules. The interposers also have a low elastic modulus to reduce thermo-mechanical stresses. Additionally, there is no need to surface-finish the interposers for bonding by silver-sintering.

To demonstrate the advantages of sintered-silver interposers according to the embodiments, a number of double-side cooled half-bridge power modules are described herein. First, the layout and design of the power modules and the thermal and thermo-mechanical simulations are described to show the advantages of the porous sintered-silver interposers. Then, a process for fabricating the interposers and the modules are also described, along with some example electrical performance measurements.

In one case, a double-side cooled half-bridge module including two 1200 V, 149 A SiC MOSFETs was designed, fabricated, and characterized. By using sintered-silver rather than solid copper interposers, simulated results showed that, at a total power loss of 200 W, the thermo-mechanical stress at vulnerable interfaces (e.g., the interposer-attach layer) could be reduced by about 42%. The thermo-mechanical stress in the SiC MOSFET could be reduced by about 50% with a trade-off of only 3.6% increase in junction temperature. The sintered-silver interposers were fabricated into desired dimensions without post-machining and did not require any surface finishing for die-bonding and substrate interconnection by silver sintering. The porous interposers were also deformable under a low force or pressure, which helped to accommodate for variations in chip thickness and substrate-to-substrate gap variations, thus simplifying the fabrication of the modules described herein. Experimental results on the electrical performance of the power modules validated the success of using the porous silver interposers for fabricating planar, double-side cooled power modules.

Figure 1B:
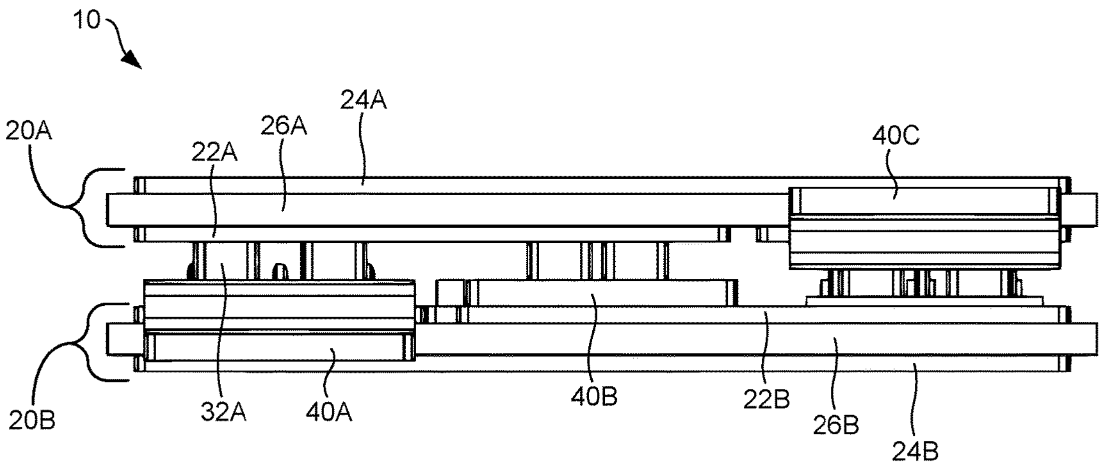
FIG. 1B is a back side view of the half-bridge power module shown in FIG. 1A according to various aspects of the embodiments.
Figure 1C:
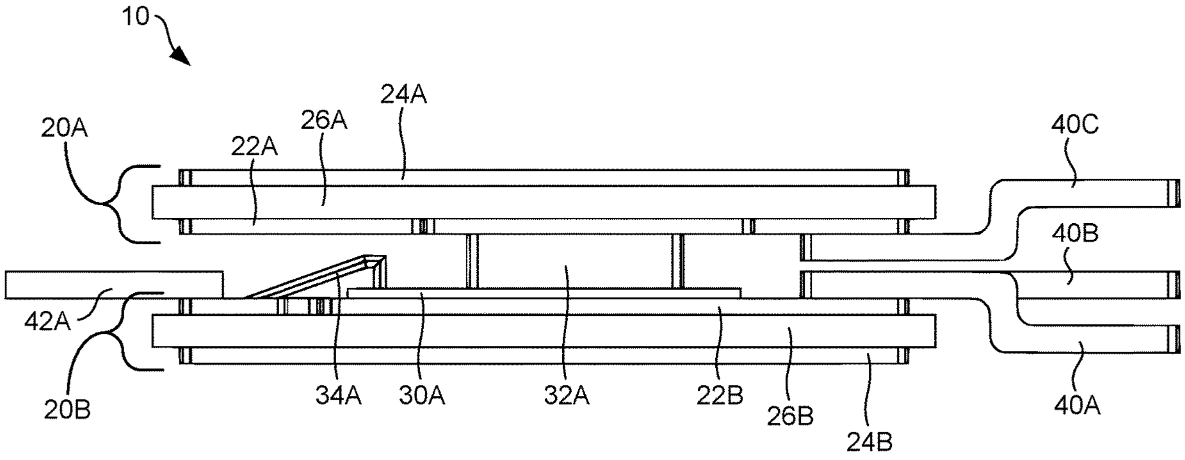
FIG. 1C is a right side view of the half-bridge power module shown in FIG. 1A according to various aspects of the embodiments.

Turning to the drawings, FIG. 1A illustrates a half-bridge power module 10 according to various aspects of the embodiments. FIG. 1B is a back side view of the half-bridge power module 10, and FIG. 1C is a right side view of the half-bridge power module 10. The power module 10 is illustrated as a representative example in FIGS. 1A-1C. The power module 10 is not drawn to any particular scale in FIGS. 1A-1C, and the relative sizes of the individual parts, pieces, or components can vary as compared to that shown. FIGS. 1A-1C are also not drawn exhaustively, meaning that the power module 10 can include other parts, pieces, or components that are not shown in FIGS. 1A-1C. Additionally, one or more of the parts, pieces, or components shown in FIGS. 1A-1C can be omitted in some cases.

The power module 10 is a packaged semiconductor module suitable for use in high efficiency and high power-density power converters, traction inverters in electric drives, and other applications. Referring among FIGS. 1A-1C, the power module 10 includes a first substrate 20A and a second substrate 20B, a first semiconductor transistor die 30A and a second semiconductor transistor die 30B (see also FIG. 2B)(collectively "transistor die 30"), a first terminal 40A, a second terminal 40B, and a third terminal 40C (collectively "terminals 40"), a number of terminal pins 42A-42H (collectively "terminal pins 42"), a number of sintered-silver interposers 32A-32F (see also FIG. 2B) (collectively "interposers 32"), and a number of wire bonds 34A-34F (see also FIG. 2B) (collectively "wire bonds 34").

Referring to FIGS. 1B and 1C, the substrate 20A includes a first inner metal layer 22A, an outer metal layer 24A, and an intermediate layer 26A. The intermediate layer 26A is positioned between the metal layer 22A and the metal layer 24A, and the metal layers 22A and 24A are bonded to the intermediate layer 26A in the substrate 20A. The metal layer 22A and the metal layer 24A can each be embodied as a layer of metal, such as copper, aluminum, or another metal with a high thermal conductivity suitable for conducting heat. The intermediate layer 26A can be an insulating layer, such as a layer of ceramic, aluminum oxide, alumina, aluminum nitride, or another ceramic, although other materials, including polymers, can be relied upon. The material used for the intermediate layer 26A is preferably an insulator that exhibits relatively high thermal conductivity. Thus, the first inner metal layer 22A is electrically isolated from the outer metal layer 24A, although heat conducts from the metal layer 22A, through the intermediate layer 26A, to the metal layer 24A. In one example, the first substrate 20A can be embodied as an insulated metal substrate (IMS), such as a direct bonded copper (DBC) substrate with an insulating ceramic or polymer layer thickness ranging from 0.25 mm to 1.5 mm or more, such as thicknesses equal to 0.38 mm, 0.5 mm, 0.63 mm, or 1.0 mm, among other suitable thicknesses. Similar to the substrate 20A, the substrate 20B includes a first inner metal layer 22B, an outer metal layer 24B, and an intermediate layer 26B. The materials and arrangement of the layers in the substrate 20B can be the same as or similar to the substrate 20A. However, the substrates 20A and 20B can be formed from different materials as compared to each other in some cases.

The first semiconductor transistor die 30A can be embodied as a power transistor in one example, although the power module 10 can incorporate other types of semiconductor devices in some cases, such as diodes, controlled rectifiers, thyristors, and other devices. Similarly, the second semiconductor transistor die 30B can be embodied as a power transistor in one example, but it can also be embodied as other types of devices. In one example, the transistor die 30A and 30B can be embodied as SiC metal oxide semiconductor field effect power transistors, although they can be embodied as other types of devices formed from the same or other types of semiconductor materials. In the power module 10, the transistor die 30A and 30B are electrically coupled in a half bridge configuration between the first substrate 20A and the second substrate 20B. The electrical couplings are facilitated in part by the metal layer 22A of the first substrate 20A and the metal layer 22B of the second substrate 20B, as described in further detail below with reference to FIGS. 2A and 2B.

The first and second semiconductor transistor die 30A and 30B can be embodied as transistors formed from a wide-bandgap material, such as semiconductor materials in the group IV family and semiconductor compounds in the group III-V and family, including SiC and GaN, among others. Wide-bandgap semiconductor materials can be relied upon to form devices capable of operating at much higher voltages, frequencies, and temperatures than conventional semiconductor materials like silicon. The power module 10 is not limited to the incorporation of only wide-bandgap semiconductor devices, however, because the power module 10 can include semiconductor devices formed from silicon and other materials.

The first terminal 40A can be embodied as a metal (e.g., copper or another conductor) terminal or flange for electrical contact with the power module 10. Similarly, the second terminal 40B and the third terminal 40C can also be embodied as metal terminals or flanges for electrical contact with the power module 10. The terminals 40A, 40B, and 40C can be relied upon as power terminals of the power module 10, and they are staggered in space for electrical coupling to a bus bar in the example shown.

Although not shown in FIGS. 1A-1C, the power module 10 can include a housing. The housing can be embodied as an enclosure made of Ultem or polyetherimide (PEI), as examples, although other materials can be relied upon. The housing can also be filled with an insulating encapsulant, such as a silicone gel or other suitable material. PEI is a good electrical insulator with a high continuous working temperature of 171° C. and a high heat deflection temperature of 216° C. Silicone gels are also good electrical insulators and have good flow characteristics that, before curing, can fill narrow gaps inside the power module 10.

Figure 2A:
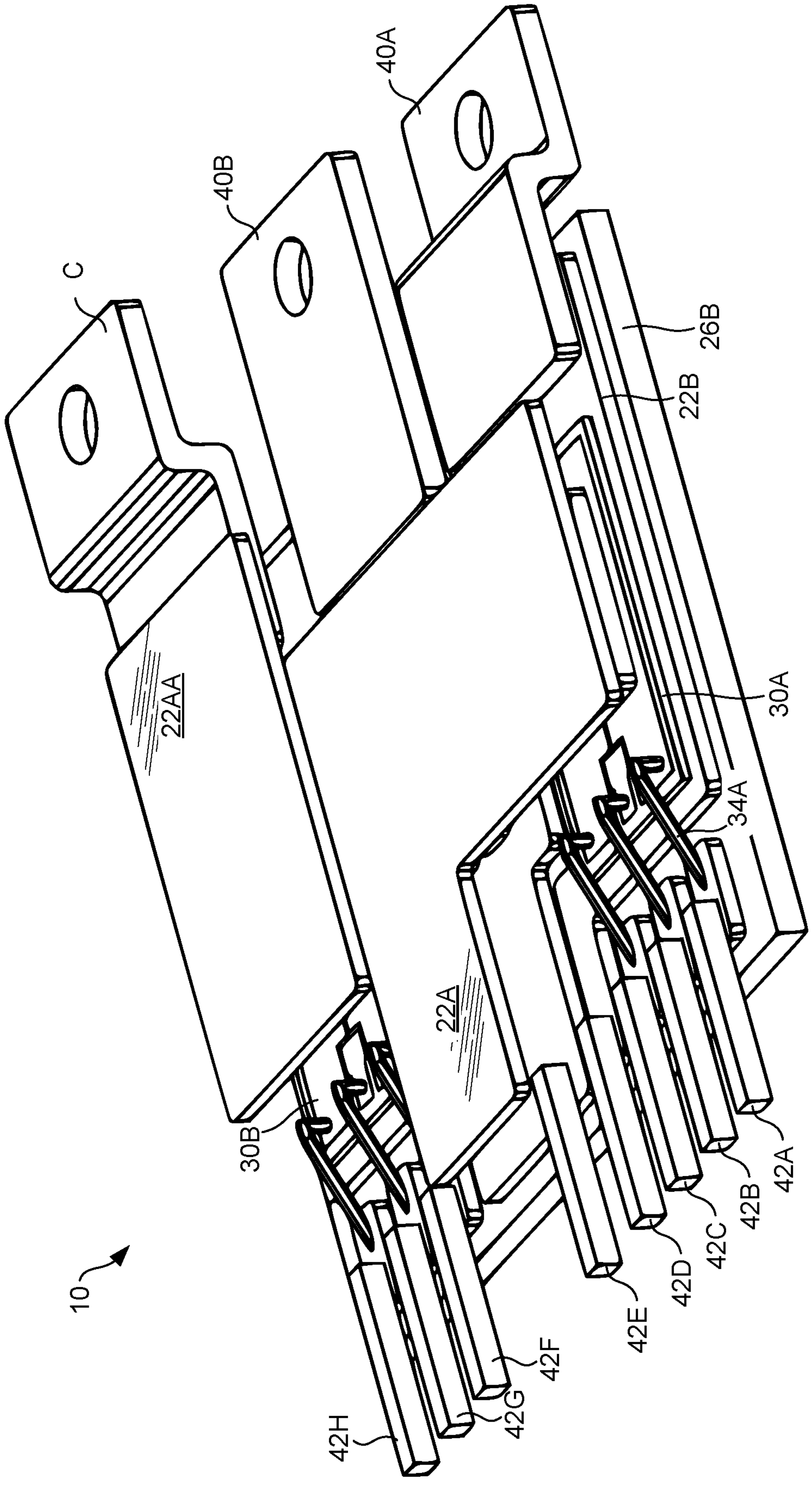
FIG. 2A illustrates the half-bridge power module shown in FIG. 1A, with certain layers omitted from view.

Turning to other features of the power module 10, FIG. 2A illustrates the power module 10 shown in FIG. 1A, with the outer metal layer 24A and the intermediate layer 26A of the substrate 20A omitted from view. As shown, the substrate 20A includes two inner metal layers, particularly the first inner metal layer 22A and a second inner metal layer 22AA, which are electrically separated from each other. The substrate 20A can include any number of inner metal layers, including more than two in some cases, and the use of two metal layers is an example. The number, shapes, and sizes of the inner and outer metal layers of the substrate 20A can vary in some cases compared to that shown.

Figure 2B:
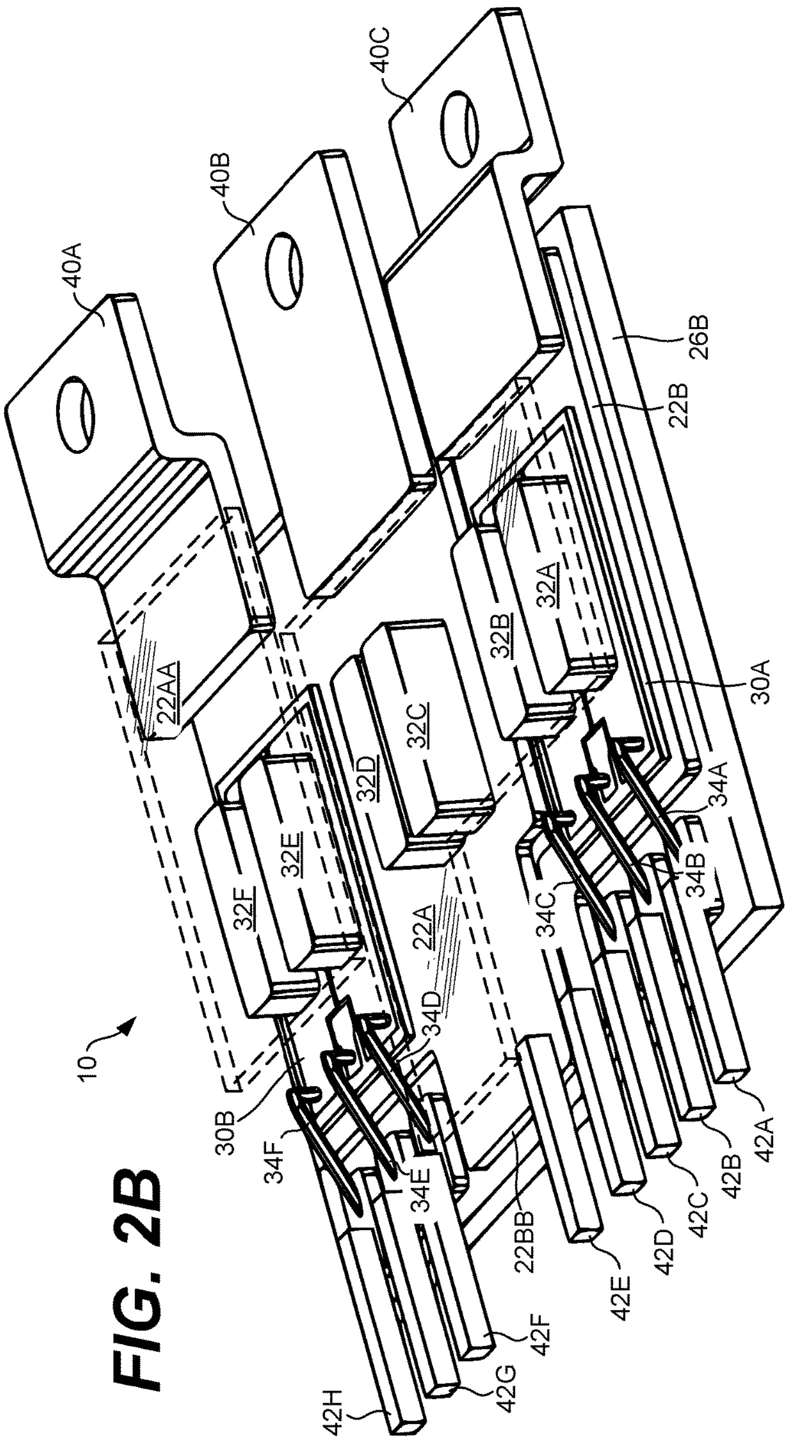
FIG. 2B illustrates the half-bridge power module shown in FIG. 1A, with certain layers omitted from view.

FIG. 2B illustrates the power module 10 with the outer metal layer 24A, the intermediate layer 26A, and the inner metal layers 22A and 22AA of the substrate 20A omitted from view. The inner metal layers 22A and 22AA are shown as hidden boxes, so that the remaining components of the power module 10 can be seen. Among other components, FIG. 2B shows the first semiconductor transistor die 30A, the second semiconductor transistor die 30B, the terminals 40A, 40B, and 40C, the terminal pins 42A-42H, the sintered-silver interposers 32A-32F, and the wire bonds 34A-34F.

FIG. 2B also shows that the substrate 20B includes both the first inner metal layer 22B and a second inner metal layer 22BB, which are electrically separated from each other. The substrate 20B can include any number of inner metal layers, including more than two in some cases, and the use of two metal layers is a representative example in FIG. 2B. The number, shape, and size of the metal layers 22A and 22AA can also vary in some cases as compared to that shown.

The electrical couplings in the power module 10 are now described with reference to FIG. 2B. The transistor die 30A includes a drain contact on its bottom surface, two source contacts on its top surface, and a gate contact on its top surface. The transistor die 30B also includes a drain contact on its bottom surface, two source contacts on its top surface, and a gate contact on its top surface. The first semiconductor transistor die 30A is mounted on and electrically coupled to the first inner metal layer 22B, and the second semiconductor transistor die 30B is mounted on and electrically coupled to the second inner metal layer 22BB. The transistor die 30A and 30B can be chip-bonded using the same silver paste used to form the sintered-silver interposers 32, as described below. Thus, the drain contact of the transistor die 30A is electrically coupled to the first inner metal layer 22B, and the drain contact of the transistor die 30B is electrically coupled to the second inner metal layer 22BB.

The terminal 40A is electrically coupled to the second inner metal layer 22AA, the terminal 40B is electrically coupled to the second inner metal layer 22BB, and the terminal 40C is electrically coupled to the first inner metal layer 22B. The sintered-silver interposers 32A and 32B are electrically coupled between the source contacts of the transistor die 30A and the first inner metal layer 22A (see also FIG. 2A) of the substrate 20A. The sintered-silver interposers 32F and 32E are electrically coupled between the source contacts of the transistor die 30B and the second inner metal layer 22AA (see also FIG. 2A) of the substrate 20A. The sintered-silver interposers 32A and 32B are electrically coupled between the second inner metal layer 22BB of the substrate 20B and the first inner metal layer 22A of the substrate 20A. The interposers 32 can be bonded and electrically coupled to the contacts of the transistor die 30A and 30B and to the substrates 20A and 20B using the same silver paste used to form the sintered-silver interposers 32 themselves, as described below.

The sintered-silver interposers 32 can be formed from a silver or nanosilver paste, including a silver powder that is dispersed in a binder for printing, spreading, or dispensing. In one example, the sintered-silver interposers 32 can be formed from NanoTach® X Series nanosilver paste of NBE Technologies, LLC, of Blacksburg, VA, USA, although other types of silver or nanosilver paste can be used. The silver paste can be used for making the sintered-silver interposers 32, chip-bonding, and interposer-chip and interposer-substrate bonding in the power module 10.

To make the sintered-silver interposers 32, a trench was machined on a Teflon block, with a width of the trench being one dimension and a depth of the trench being another of the two dimensions of the interposers 32. The silver paste was squeezed into the trench using a squeegee, followed by pressure-less sintering at 245° C. for 15 mins. The sintered-silver bars were easily demolded out of the trench and cut into individual ones of the interposers 32. The sintered-silver bars include a porous microstructure and are plastically deformable under heat and pressure, as described in further detail below. Due to shrinkage after sintering, the top surface of the sintered-silver bars can be recessed in some cases. Because the width of the trench defined the height of the interposer, height uniformity of the interposers was ensured. The two other dimensions of the interposer, one being the recessed depth and the other being the cut length from the bar, are not necessarily critical in view of the methods of assembly described below.

The wire bonds 34A-34C are electrically coupled between the transistor die 30A and the terminal pins 42A-42C, and the wire bonds 34D-34F are electrically coupled between the transistor die 30B and the terminal pins 42F-42H. Particularly, the wire bonds 34A and 34C are electrically coupled between one or more source contacts of the transistor die 30A and the terminal pins 42A and 42C. The wire bond 34B is electrically coupled between the gate contact of the transistor die 30A and the terminal pin 42B. Additionally, the wire bonds 34D and 34F are electrically coupled between one or more source contacts of the transistor die 30B and the terminal pins 42F and 42H. The wire bond 34E is electrically coupled between the gate contact of the transistor die 30B and the terminal pin 42G. Power can be applied through the terminals 40A, 40B, and 40C of the power module 10, and voltage measurement and signaling (including gate drive signaling) can be applied through the terminal pins 42A-42H of the power module 10.

Figure 3:
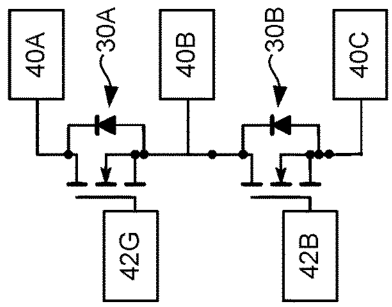
FIG. 3 illustrates an electrical circuit diagram for the semiconductor devices in the half-bridge power module shown in FIG. 1A according to various aspects of the embodiments.

FIG. 3 illustrates an electrical circuit diagram of the transistor die 30A and 30B in the power module 10. The transistor die 30A and 30B are arranged in a half-bridge as shown. Power can be applied through the terminals 40A, 40B, and 40C of the power module 10. Gate drive signaling to the transistor die 30A and 30B can be applied through the terminal pins 42G and 42B of the power module 10, respectively, as shown in FIG. 3.

The dimensions of the power module 10, in one example implementation, were 2.4 cm×1.8 cm×0.36 cm. The terminals 40 are on one side of the power module 10, and the terminal pins 42 are on another side of the power module 10. The configuration of the terminals 40 can be tailored to different busbar structures. Other than the terminal pins 42B and 42G, which are for gate drive, the rest of the terminal pins can be relied upon for current sensor and desaturation protection, among other purposes. In the example implementation, parasitic inductances of the power loop and drive loop were 4.4 nH and 3.0 nH, as extracted from ANSYS Q3D, respectively. The low power loop parasitic inductance can be attributed to having two parallel metal planes for routing.

ANSYS Workbench was used to simulate the temperature distributions in the power module 10. For comparison, the temperature distributions of the power module 10 with Cu and Mo interposers were also simulated. The thermal conductivities of Cu, Mo, and sintered-silver are 385 W/m ° C., 142 W/m ° C., and 175 W/m ° C., respectively. The high thermal conductivity of sintered-silver can be attributed to the percolation of the silver matrix with microstructurally distributed pores. In the simulations, the power dissipation from each transistor device was varied from 10 W to 100 W at an increment of 10 W, and the initial temperature was set at 22° C. Since both the transistor die 30A and 30B in the power module 10 were die-attached on the substrate 20B, for single-side cooling, a convection coefficient of 8000 W/m2·° C. was assumed at the substrate 20B and 20 W/m2·° C. at the substrate 20A. For double-side cooling, a convection coefficient of 8000 W/m2·° C. was assumed at both substrates 20A and 20B.

Although the different types of interposer materials (i.e., Ag, Cu, and Mo) have thermal conductivity values differing by nearly 300%, the differences in their junction temperatures (Tj) were small in simulation, at less than 5% difference under either single-sided or double-sided cooling. This is because a major portion of the heat generated in the power module 10 was dissipated away through the die-attach layer, not through the interposers. Nevertheless, the effect of double-sided cooling was shown to be significant in simulation, at approximately 30% in reduction of the junction temperature as compared to single-sided cooling. For example, at a total power loss of 200 W (100 W from each chip), the Tj of the module with the sintered-silver interposer and double-sides cooling decreased by 28% (or 46° C.) over that with single-sides cooling.

Using IMS or DBC substrates with thicker insulating layers can contribute to higher junction-to-case thermal resistance. This is because the thermal conductivity of the insulating ceramic or aluminum nitride layer is about 15 times lower than that of the copper metal layers in the DBC substrates. Thus, using IMS or DBC substrates with thinner insulating layers can offer a thermal benefit. The insulating layers of IMS or DBC substrates cannot be too thin, however, because dielectric breakdown can lead to failure of power modules. IMS or DBC substrates with ceramic thicknesses equal to 0.38 mm, 0.5 mm, 0.63 mm, 1.0 mm, or other thicknesses can be relied upon, as examples, depending on the application or use case for the power modules.

In simulations, power modules similar to the power module 10, with double-side cooling, were shown to have not only lower Tj, but also more uniform temperature distributions. Thermal simulations were run for plots of the chip power loss versus the heatsink convection coefficient with the maximum allowed junction temperature to be 150, 200, or 250° C. The simulations showed that double-side cooling significantly improves the chip power handling capability. For example, assuming a convection coefficient of 10000 W/m2·° C. and the maximum junction temperature of 150° C., the maximum power loss per chip that the power module 10 can support is about 107 W if cooled from one side and is 161 W if cooled from both sides. Thus, double-side cooling gives the power module 10 about 50% more power handling capability than single-side cooling.

ANSYS Workbench was also used to simulate the thermo-mechanical stresses in the double-side cooled power module 10 with Cu, Mo, and sintered-silver interposers. Table I, below, lists some of the material properties of the Cu, Mo, and sintered-silver.

TABLE I

MATERIAL PROPERTIES OF CU, MO, AND SINTERED-AG

| Material | Elastic modulus (GPa) | CTE (ppm/° C.) | Thermal conductivity (W/(m · ° C.)) | Density (kg/m$^3$) |
|---|---|---|---|---|
| Cu | 128 | 16.5 | 385 | 8960 |
| Mo | 320 | 4.9 | 142 | 10200 |
| Sintered-Ag | 6 | 18.9 | 175 | 8500 |

In the simulations, the Anand viscoelasticity model was used to describe the viscoelastic behavior of all sintered-silver elements with parameters taken from reference materials. Other material parameters for the simulations are listed in Table I above. To simplify the simulations, the wire-bonds and encapsulant were ignored. The stress-free temperature was set at 245° C., close to the silver-sintering temperature for die-attach and interposer-attach. The simulation runs included first finding the thermo-mechanical stresses due to cooling from the sintering temperature down to room temperature and then the stresses from heating by the total module power loss of 200 W, or 100 W per chip.

In reliability studies of power modules, simulations at vulnerable joint locations are widely used to correlate with reliability measurement data. Stresses of attached layers using several spacer or interposer geometries were simulated to evaluate the embodiments, and the number of temperature cycles to failure were also measured by simulation. The testing showed that the number of cycles to failure is inversely correlated to the maximum von Mises stress. Based on the results of simulation, the sintered-silver interposers had the lowest stress among all the interposer materials, namely 81% and 69% lower than the Cu and Mo interposers, respectively. This is because the sintered-silver has two orders of magnitude lower elastic modulus and no CTE mismatch between the sintered-silver interposer and sintered-silver attachment. The stresses in the SiC MOSFETs were also significantly reduced when using sintered-silver interposers, by 50% and 32% compared to that with Cu and Mo interposers, respectively.

In testing, the stresses at the bonded interfaces with the sintered-silver interposers were much lower than those with Cu interposers while they were similar to those with the Mo interposers. Of the three bonded interfaces in each module, the interposer-to-substrate interface had the highest stress, thus it is the most likely sites to fail first. In view of the thermal simulation results, it is possible to realize substantial reductions in thermo-mechanical stresses at vulnerable interfaces by using sintered-silver instead of Cu interposers in the power module 10, with only a minor increase in junction temperature.

Table III is an example list of materials that can be used in the power module 10. However, the use of other materials and devices for the power module 10 is within the scope of the embodiments.

TABLE III

| Part | Materials | Specifications |
|---|---|---|
| SiC MOSFET | CREE CPM3-1200-0013A | 1.2 kV, 149 A, and 13 mΩ |
| Substrate | Rogers AlN-DBC with Ag finish | Cu/AlN/Cu thickness: 0.3 mm/0.6 mm/0.3 mm |
| Chip attach | NBE Tech Nanosilver paste | Melting temp.: 961° C. Printed thickness: 50 μm |
| Interposer-chip attach & interposer-substrate attach | NBE Tech Nanosilver paste | Melting temp.: 961° C. Printed thickness: 100 μm |
| Interposer | Sintered-Ag made by NBE Tech Nanosilver paste | Dimension: 4 × 1 × 1 $mm^3$ and 4 × 1 × 1.2 $mm^3$ |
| Gate-bonding wire | TANAKA Aluminum wire | Diameter: 0.25 mm |
| Encapsulant | LORD ME-531 underfill | Cured at 165° C. for 15 min |
| Terminals | Local machined copper plate | Thickness: 0.5 mm |
| Terminal attachment | SolderPlus Solder (Sn10/Pb88/Ag2) | Melting temp.: 278° C. |

CREE SiC MOSFET chips were used in one case for the transistor die 30A and 30B. The chips are rated at 1.2 kV, 149 A, and 13 mΩ and have drain pads metallized with a nickel (Ni)/gold (Au) surface finish, which is compatible with silver-sintering. However, the source and gate pads were aluminum (Al), which is wire-bondable but not silver-sinterable. To make the source pads silver-sinterable, a metallization of 100-nm of titanium (Ti) and 100-nm of Ag was deposited by magnetron sputtering through a stainless-steel contact mask. Since the gate pad was too small for the metallization process, the gate and Kevin-source pads were wire-bonded by a 0.25 mm-diameter Al wire. The DBC substrates used for the substrates 20A and 20B were obtained from Rogers, Inc. and came with Ag surface finish for bonding by silver-sintering. The terminal pins 42 were locally machined from copper plates and attached to the power module 10 by soldering with a high-Pb solder alloy. An underfill material was used to encapsulate the transistor die 30A and 30B and bond the structure together.

Figure 4:
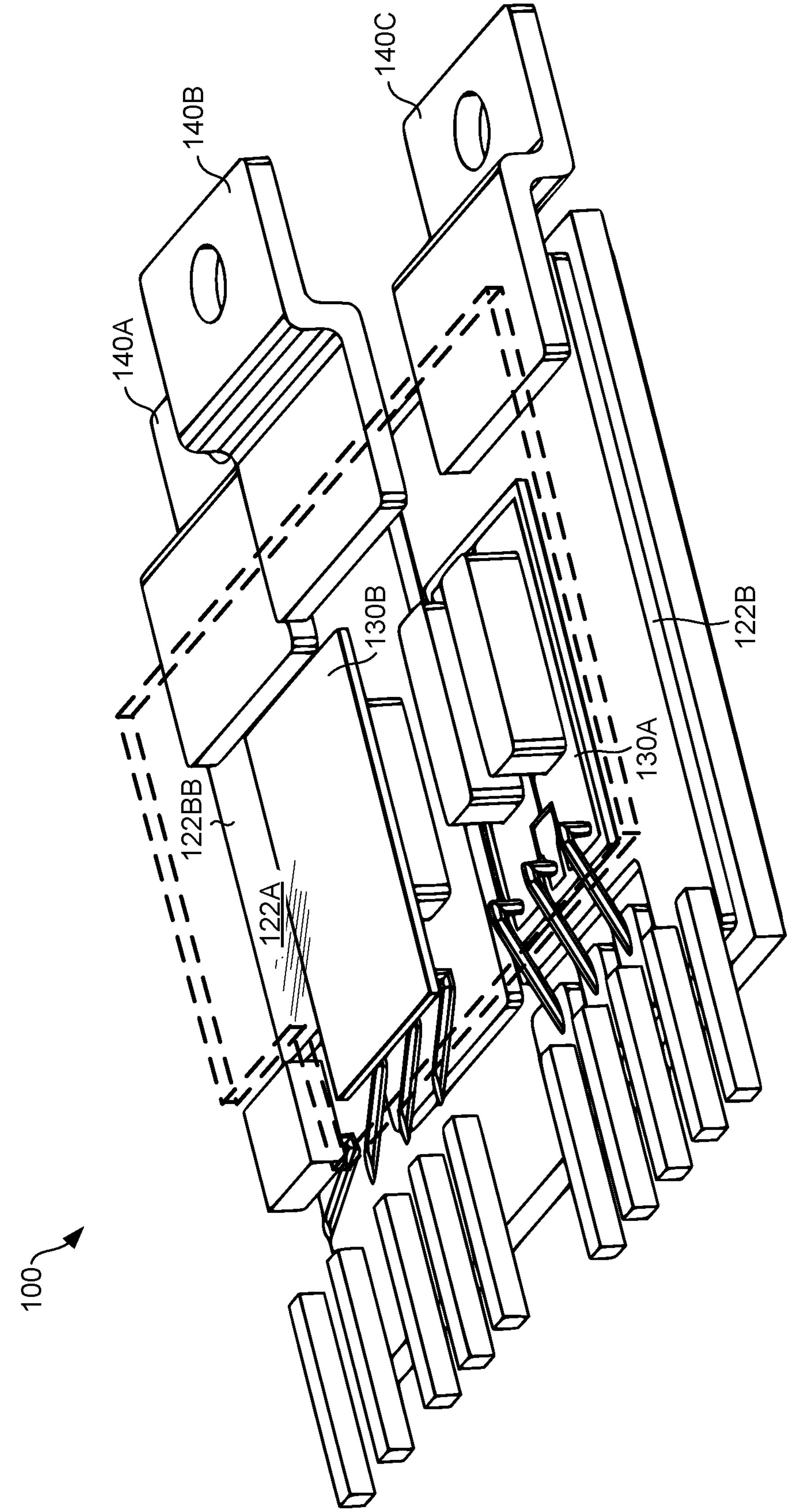
FIG. 4 illustrates another half-bridge power module according to various aspects of the embodiments.

FIG. 4 illustrates another half-bridge power module 100 according to various aspects of the embodiments. The components used in the power module 100 are similar to those used in the power module 10. Like the power module 10, the power module 100 includes a half-bridge arrangement of the first semiconductor transistor die 130A and the second semiconductor transistor die 130B (collectively "transistor die 130"). However, as compared to the power module 10, the transistor die 130 are mounted to different substrates in the power module 100. Particularly, the second semiconductor transistor die 130B is chip-bonded with silver paste to the inner metal layer 122A of the top substrate (omitted from view, in part) of the power module 100. In FIG. 4, the inner metal layer 122A is shown as a hidden box, so that the remaining components of the power module 100 can be seen. The first semiconductor transistor die 130A is chip-bonded with silver paste to the inner metal layer 122B of the bottom substrate of the power module 100.

With the arrangement shown in FIG. 4, the transistor die 130 are both repositioned closer to the center of the power module 100. Additionally, heat from the transistor die 130 can be spread separately between the top and bottom substrates, which can improve the thermal performance of the power module 100. Additionally, the power module 100 includes a different configuration of the terminals 140A, 140B, and 140C. The terminal 140A is electrically coupled to the inner metal layer 122BB of the bottom substrate, the terminal 140B is electrically coupled to the inner metal layer 122A of the top substrate, and the terminal 140C is electrically coupled to the inner metal layer 122B of the bottom substrate.

Figure 5:
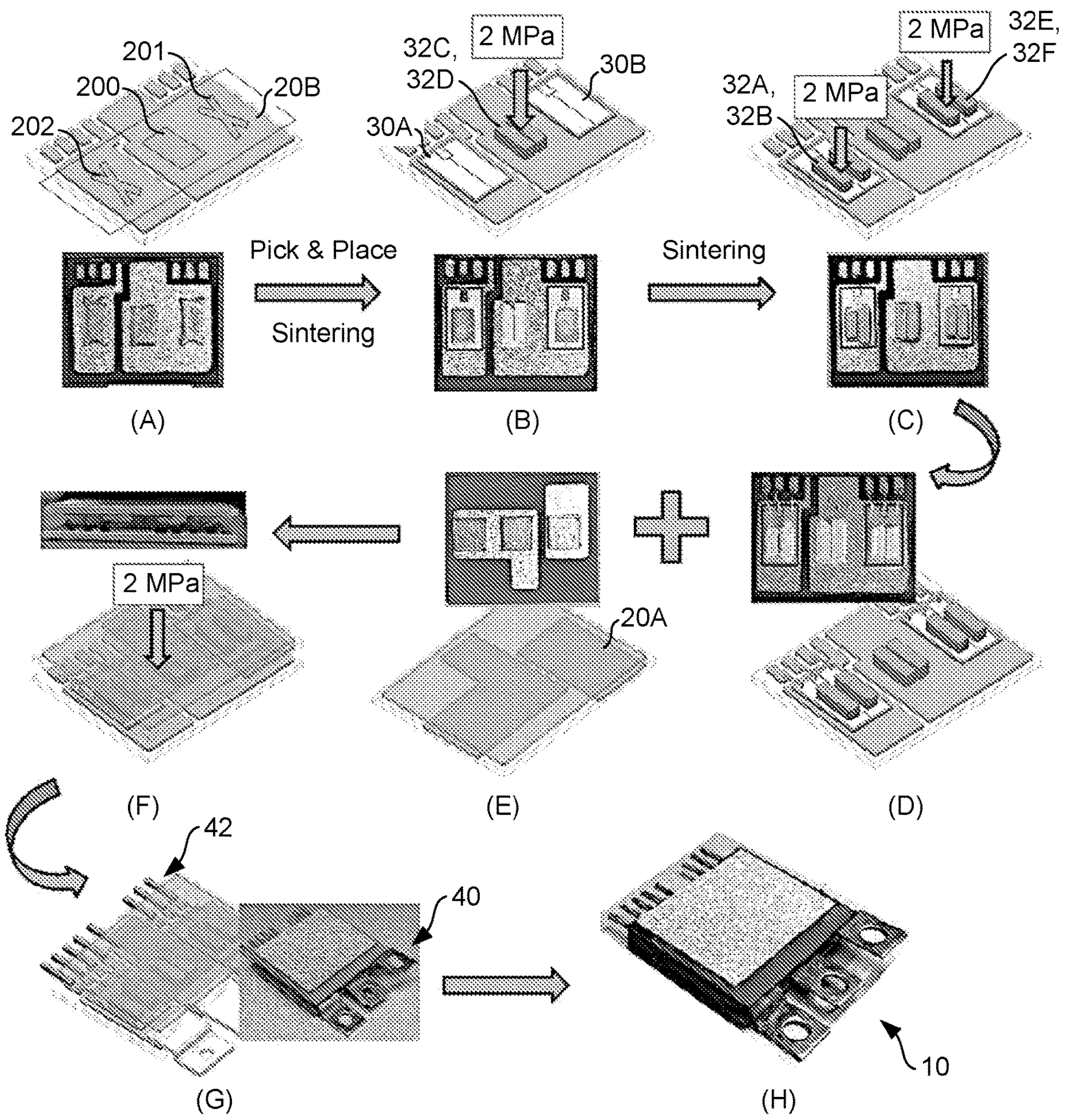
FIG. 5 shows an example process for fabricating the half-bridge modules described herein according to various aspects of the embodiments.

FIG. 5 shows an example process for fabricating the half-bridge modules described herein according to various aspects of the embodiments. The process described in FIG. 5 can be used to assemble or manufacture the power module 10, the power module 100, or similar power modules according to the embodiments. The process is described in connection with the components of the power module 10 as one example, although the process can be used to manufacture other power modules.

In step (A), the process includes printing or applying a layer of silver paste on the substrate 20B at certain locations for bonding semiconductor die and interposers. The silver paste can be the silver paste of NBE Technologies, LLC, as described herein, although other silver pastes can be relied upon. As shown in FIG. 5, the silver paste can be patterned at the locations 200-202 for bonding the semiconductor transistor die 30A and 30B and the interposers 32C and 32D to the substrate 20B.

In step (B), the process includes positioning the semiconductor transistor die 30A and 30B and the interposers 32C and 32D at the locations where the silver paste was spread in step (A). As part of step (B), the process can also include heating the assembly at a constant ramp rate of about 5° C./min (i.e., within +/−10% of 5° C./min) from room temperature to about 245° C. (i.e., within +/−10% of 245° C.). Once the temperature of about 245° C. is reached, downward pressure is applied at a top of the interposers 32C and 32D for about 15 min, maintaining the 245° C. temperature, to sinter the chip-attach and interposer-to-substrate attach. A pressure of 2-MPa can be applied in this step, although larger and smaller amounts of pressure can be applied in other cases, depending on the size and plasticity of the interposers, among other factors.

At step (C), the process includes printing or applying silver paste over the top contacts of the semiconductor transistor die 30A and 30B at locations for the interposers 32A, 32B, 32E, and 32F. The process also includes positioning the interposers 32A, 32B, 32E, and 32F on the silver paste over the semiconductor transistor die 30A and 30B. As part of step (C), the process can also include heating the assembly at a ramp rate of about 5° C./min from room temperature to about 245° C. Once the temperature of about 245° C. is reached, pressure is applied to the interposers 32A, 32B, 32E, and 32F for about 15 min, maintaining the 245° C. temperature, to sinter the interposer-to-chip attach. A pressure of 2-Pa can be applied in this step.

At step (D), the process can include wire-bonding the gate and source pads of the semiconductor transistor die 30A and 30B to the metal contact pads of the bottom substrate 20B, for connection to the terminal pins of the power module 10. At step (E), the process includes printing or applying silver paste on the top substrate 20A at locations for top-attach to the semiconductor transistor die 30A and 30B and the interposers 32A-32F.

At step (F), the process includes arranging the top substrate 20A over the semiconductor transitory die 30A and 30B, the interposers 32A-32F, and the bottom substrate 20B. The process also includes heating the assembly at a ramp rate of about 5° C./min from room temperature to about 245° C. Once the temperature of about 245° C. is reached, pressure is applied to the top substrate 20A for about 15 min, maintaining the 245° C. temperature, to sinter the attach. A pressure of 2-MPa can be applied in this step. A hot press can be used in step (F). Buffer sheets of rubber and Teflon can be used between the top platen of the hot press and the top substrate 20A, to ensure uniform pressure applied on the power module 10.

At step (G), the process includes soldering the terminals 40 and the terminal pins 42 in place as described herein. In step (H), the process includes adding or extruding an underfill material into the empty space between the two substrates 20A and 20B and curing the underfill in place. The encapsulation material keeps oxygen and or moisture away from the silver joints and interposers, thus mitigating the silver migration risk.

Step (H) in FIG. 5 shows the finished half-bridge power module 10, which measured at 2.7 cmx 1.9 cmx 0.4 cm in one example case. The thickness variation of the module was less than 0.01 cm, which can easily be compensated by a thermal interface material to be inserted between the module and heatsink.

Of the steps described above, step (F) is relatively important. Here, the pressure-assisted sintering is helpful to close any gaps in the interconnection caused by variations in chip thickness, interposer height, and substrate distortion. If the heights of the interposers are different, for example, at first all of the applied load is applied to the taller one(s), which then quickly shrank due to their porous structure until all the interposers were leveled and evenly shared the load. The fact that sintered-silver interposers can be easily deformed under a low load significantly increases assembly yield.

The static characteristics of the power module 10 were tested using a curve tracer. Testing showed that the leakage currents of the transistors were the same, before and after packaging. The package interconnects and terminal leads only added about 2 mΩ of on-resistance to the device. Overall, the static I-V characteristics of the packaged die were similar to those of the bare die. Similarities of the static characteristics between the packaged and bare device suggest that the packaging process described herein, including the sintering steps under 2-Pa pressure, did not alter the device characteristics.

Although embodiments have been described herein in detail, the descriptions are by way of example. In other words, the embodiments of the frame described herein are not limited to frame structures for aircraft, however, and may be relied upon as frame structures for both airborne and ground-based crafts, vehicles, etc. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

The invention claimed is:

1. A power module, comprising:

a first substrate;

a second substrate comprising a first inner metal layer and a second inner metal layer;

a plurality of semiconductor transistor die positioned between the first substrate and the second substrate, a bottom surface of a first semiconductor transistor die among the plurality of semiconductor transistor die being secured in electrical contact to the first inner metal layer of the second substrate using sintered silver paste and a bottom surface of a second semiconductor transistor die among the plurality of semiconductor transistor die being secured in electrical contact to the second inner metal layer of the second substrate using sintered silver paste;

a plurality of power terminals;

a plurality of terminal pins; and a first plurality of sintered-silver interposers bonded to a top contact of the first semiconductor transistor die and positioned between the first substrate and the second substrate in the power module and a second plurality of sintered-silver interposers bonded to a top contact of the second semiconductor transistor die and positioned between the first substrate and the second substrate in the power module.

2. The power module of claim 1, wherein at least one of the first substrate or the second substrate comprises an insulated metal substrate (IMS).

3. The power module of claim 2, wherein the IMS comprises a layer of ceramic or polymer between two layers of copper.

4. The power module of claim 2, wherein:

the second substrate comprises an insulated metal substrate (IMS); and the IMS comprises a layer of ceramic or polymer, the first inner metal layer, and the second inner metal layer.

5. The power module of claim 4, wherein:

a first power terminal among the plurality of power terminals is electrically coupled to the first inner metal layer; and a second power terminal among the plurality of power terminals is electrically coupled to the second inner metal layer.

6. The power module of claim 1, wherein:

a bottom surface of a third semiconductor transistor die among the plurality of semiconductor transistor die is bonded to the first inner metal layer of the second substrate using sintered silver paste; and the power module further comprises a third plurality of sintered-silver interposers bonded to a top contact of the third semiconductor transistor die and positioned between the first substrate and the second substrate in the power module.

7. The power module of claim 1, wherein the plurality of power terminals are staggered for electrical coupling to a busbar.

8. The power module of claim 1, further comprising:

a first plurality of bond wires electrically coupled from the first semiconductor transistor die among the plurality of semiconductor transistor die to a first subset of the plurality of terminal pins; and a second plurality of bond wires electrically coupled from the second semiconductor transistor die among the plurality of semiconductor transistor die to a second subset of the plurality of terminal pins.

9. The power module of claim 1, wherein:

the plurality of semiconductor transistor die are coupled in a half bridge configuration; and each of the plurality of semiconductor transistor die comprises a Silicon Carbide (SiC) metal oxide semiconductor field effect power transistor.

10. The power module of claim 1, wherein the plurality of sintered-silver interposers comprise interposers cut from a bar of sintered silver paste.

11. A method of manufacturing a power module, comprising:

applying a layer of silver paste on a metal layer of a substrate;

positioning a plurality of semiconductor transistor die on the layer of silver paste over the metal layer of the substrate;

positioning a plurality of silver interposers on the layer of silver paste over the metal layer of the substrate; and heating the substrate, the plurality of semiconductor transistor die, and the plurality of silver interposers, to bond the plurality of semiconductor transistor die and the plurality of silver interposers to the substrate, wherein:

the heating comprises heating at a ramp rate to a temperature of about 245° C.; and the method further comprises applying pressure to the plurality of silver interposers after reaching the temperature of about 245° C.

12. The method of claim 11, wherein applying the pressure comprises applying a pressure of about 2-MPa for about 15 minutes.

13. The method of claim 11, further comprising:

applying a second layer of silver paste on top surface contacts of the plurality of semiconductor transistor die; and positioning a second plurality of silver interposers on the second layer of silver paste over the top surface contacts of the plurality of semiconductor transistor die.

14. The method of claim 13, further comprising:

second heating the substrate, the plurality of semiconductor transistor die, the plurality of silver interposers, and the second plurality of silver interposers, to bond the second plurality of silver interposers to the plurality of semiconductor transistor die.

15. The method of claim 14, wherein:

the second heating comprises heating at a ramp rate to a temperature of about 245° C.; and the method further comprises applying pressure to the second plurality of silver interposers after reaching the temperature of about 245° C.

16. The method of claim 14, further comprising:

applying a third layer of silver paste on a metal layer of a second substrate;

positioning the second substrate over the substrate, with the third layer of silver paste facing the substrate, the plurality of semiconductor transistor die, the plurality of silver interposers, and the second plurality of silver interposers; and third heating the substrate, the second substrate, the plurality of semiconductor transistor die, the plurality of silver interposers, and the second plurality of silver interposers, to bond the second substrate to the plurality of silver interposers and the second plurality of silver interposers.

17. The method of claim 16, wherein:

the third heating comprises heating at a ramp rate to a temperature of about 245° C.; and the method further comprises applying pressure to the second substrate after reaching the temperature of about 245° C.

18. The method of claim 16, wherein the substrate and the second substrate comprise insulated metal substrates (IMSs).

19. The method of claim 11, wherein the plurality of silver interposers comprise sintered-silver interposers cut from a bar of sintered silver paste.

* * * * *